US009319076B2

(12) United States Patent
Chen et al.

(10) Patent No.: US 9,319,076 B2
(45) Date of Patent: Apr. 19, 2016

(54) MODULATION METHOD FOR IMPROVING SIGNAL CONVERSION GAIN AND HIGH-GAIN MODULATOR THEREOF

(71) Applicant: National Taiwan University, Taipei (TW)

(72) Inventors: Yi-Jan Chen, Taipei (TW); Li-Fan Tsai, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 14/559,159

(22) Filed: Dec. 3, 2014

(65) Prior Publication Data

US 2015/0318877 A1   Nov. 5, 2015

(30) Foreign Application Priority Data

Apr. 30, 2014  (TW) .............................. 103115672 A
Sep. 15, 2014  (TW) .............................. 103131747 A (51) Int. Cl.
*H04L 27/00*  (2006.01)
*H04B 1/04*  (2006.01)
*H03C 3/00*  (2006.01)

(52) U.S. Cl.
CPC ... *H04B 1/04* (2013.01); *H03C 3/00* (2013.01)

(58) Field of Classification Search
CPC ... H04L 1/0003; H04L 1/0071; H04L 5/0007; H04L 1/009; H04L 27/0008; H04L 27/2601; H04L 1/0025; H04B 1/40; H04B 3/23; H04B 1/403

USPC .......................................... 375/295, 219, 316
See application file for complete search history.

(56) References Cited

U.S. PATENT DOCUMENTS

| 5,412,351 A * | 5/1995 | Nystrom ................ H03B 27/00 329/305 |
| 2011/0043277 A1* | 2/2011 | Sakamoto ........... H04L 27/3863 329/306 |
| 2011/0241748 A1* | 10/2011 | Leong .................... H03B 27/00 327/291 |

* cited by examiner

*Primary Examiner* — Zewdu Kassa
(74) *Attorney, Agent, or Firm* — Muncy, Geissler, Olds & Lowe, P.C.

(57) ABSTRACT

A modulation method includes sampling the first input signal by using the first local oscillation signal and the second local oscillation signal to generate the first sampled signal, sampling the second input signal by using the third local oscillation signal and the fourth local oscillation signal to generate the second sampled signal, sampling the second input signal by using the first local oscillation signal and the second local oscillation signal to generate the third sampled signal, sampling the first input signal by using the third local oscillation signal and the fourth local oscillation signal to generate the fourth sampled signal, adding the first sampled signal and the second sampled signal to produce the first modulation signal, adding the third sampled signal and the fourth sampled signal to generate the second modulation signal, and adding the first modulation signal and the second modulation signal to generate an output signal.

18 Claims, 11 Drawing Sheets

MODULATION METHOD FOR IMPROVING SIGNAL CONVERSION GAIN AND HIGH-GAIN MODULATOR THEREOF

CROSS-REFERENCES TO RELATED APPLICATIONS

This non-provisional application claims priority under 35 U.S.C. §119(a) on patent application Ser. No. 103115672 and 103131747, filed in Taiwan, R.O.C. on Apr. 30, 2014 and Sep. 15, 2014, the entire contents of which are hereby incorporated by reference.

BACKGROUND

1. Technical Field

The present invention relates to a signal modulation technology applied to a communication system, and in particular, to a modulation method for improving signal conversion gain and a high-gain modulator thereof.

2. Related Art

With the need for high speed and mobility communication, various wireless communications have been developed. In addition to conventional call function, a wireless communication apparatus also needs to support services such as high-definition video function, application software, and Wi-Fi. A modulation circuit is one of the important circuits in a wireless communication apparatus.

Figure 1:
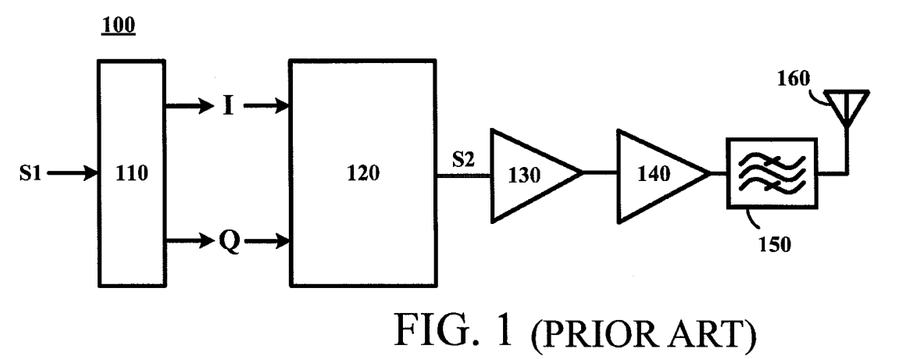
FIG. 1 is a general block diagram of a radio frequency transmitter circuit in the prior art.

FIG. 1 is a general block diagram of a radio frequency (RF) transmitter. Referring to FIG. 1, a radio frequency transmitter circuit 100 mainly consists of a digital-to-analog conversion circuit 110, a modulation circuit 120, a driver circuit 130, a power amplifier 140, a band-pass filtering circuit 150, and an antenna 160.

First, a baseband signal S1 is converted into a baseband analog signal by the digital-to-analog conversion circuit 110, and is sent, in the form of an in-phase signal I and a quadrature signal Q, to the modulation circuit 120 for processing. Subsequently, the modulation circuit 120 modulates the in-phase signal I and the quadrature signal Q to output a modulated signal S2, and then the modulated signal S2 passes through the driver circuit 130 and is amplified by the power amplifier 140. Finally, the band-pass filtering circuit 150 passes the modulated signal, the modulated signal is sent to the antenna 160 so that the modulated signal is transmitted.

In a high-speed data transmission environment, with the increase of the signal transmission rate, the power consumption of the modulation circuit also increases.

SUMMARY

In an embodiment, a high-gain modulator includes a first modulation unit, a second modulation unit, and an adder circuit. The first modulation unit modulates an input signal by using a primary local oscillation signal to generate a first modulation signal. The second modulation unit modulates the input signal by using the primary local oscillation signal to generate a second modulation signal. The first modulation signal and the second modulation signal have a phase difference. Finally, the adder circuit adds the first modulation signal and the second modulation signal to generate an output signal.

In an embodiment, a modulation method for improving signal conversion gain includes sampling a first input signal by using a first local oscillation signal and a second local oscillation signal to generate a first sampled signal, sampling a second input signal by using a third local oscillation signal and a fourth local oscillation signal to generate a second sampled signal, sampling the second input signal by using the first local oscillation signal and the second local oscillation signal to generate a third sampled signal, sampling the first input signal by using the third local oscillation signal and the fourth local oscillation signal to generate a fourth sampled signal, adding the first sampled signal and the second sampled signal to generate a first modulation signal, adding the third sampled signal and the fourth sampled signal to generate a second modulation signal, and adding the first modulation signal and the second modulation signal to generate an output signal. The first input signal and the second input signal have a phase difference. The first local oscillation signal, the second local oscillation signal, the third local oscillation signal, and the fourth local oscillation signal have different phases.

In an embodiment, a modulation method includes: based on a duty cycle of a given signal, sampling an in-phase signal in a first timeslot and a second timeslot in each cycle of the given signal, to generate a first sampled signal; based on the duty cycle of the given signal, sampling a quadrature signal in a third timeslot and a fourth timeslot in each cycle of the given signal, to generate a second sampled signal; based on the duty cycle of the given signal, sampling the quadrature signal in the first timeslot and the second timeslot in each cycle of the given signal, to generate a third sampled signal; based on the duty cycle of the given signal, sampling the in-phase signal in the third timeslot and the fourth timeslot in each cycle of the given signal, to generate a fourth sampled signal; and combining the first sampled signal, the second sampled signal, the third sampled signal, and the fourth sampled signal to form an output signal. A time difference exists between the first timeslot and the third timeslot, between the third timeslot and the second timeslot, and between the second timeslot and the fourth timeslot.

In summary, in the modulation method for improving signal conversion gain and the high-gain modulator thereof according to the present invention, two modulation units are used for modulation by using local oscillation signals, each with different phase, to perform a fully duty cycle modulation of a group of input signals, so that signal energy is fully utilized and an energy waste is avoided, thereby improving the gain of the output signal and reduce the power consumption of the entire circuit (for example, a radio frequency transmitter circuit or a radio frequency receiver circuit).

The detailed features and advantages of the present invention are described below in great detail through the following embodiments, and the content of the detailed description is sufficient for those skilled in the art to understand the technical content of the present invention and to implement the present invention accordingly. Based upon the content of the specification, the claims, and the drawings, those skilled in the art can easily understand the relevant objectives and advantages of the present invention.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 2:
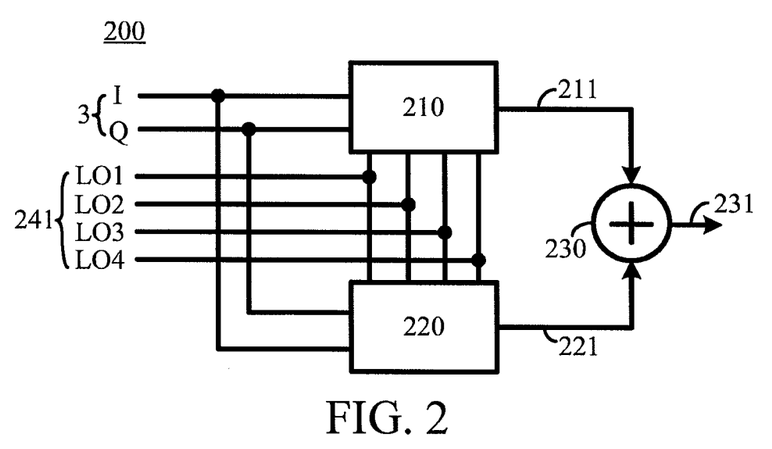
FIG. 2 is a general block diagram of a high-gain modulator according to an embodiment of the present invention.

FIG. 2 is a general block diagram of a high-gain modulator according to an embodiment of the present invention. Referring to FIG. 2, a high-gain modulator 200 includes at least two modulation units (which are called a first modulation unit 210 and a second modulation unit 220 below) and an adder circuit 230.

Two input ends of the first modulation unit 210 are electrically connected to the previous stage circuit (not shown in the figure), and receive an input signal 3 from the previous stage circuit. Four control ends of the first modulation unit 210 are electrically connected to a signal source circuit (not shown in the figure), and receive a primary local oscillation signal 241 from the signal source circuit.

In the same way, two input ends of the second modulation unit 220 are electrically connected to the previous stage circuit (not shown in the figure), and receive the input signal 3 from the previous stage circuit. Four control ends of the second modulation unit 220 are electrically connected to the signal source circuit (not shown in the figure), and receive the primary local oscillation signal 241 from the signal source circuit. Herein, the second modulation unit 220 receives the primary local oscillation signal 241 from the signal source circuit with a phase difference of 90 degrees relative to the first modulation unit 210 or the second modulation unit 220 receives the input signal 3 from the previous stage circuit in a reverse manner relative to the first modulation unit 210.

Output ends of the first modulation unit 210 and the second modulation unit 220 are electrically connected to two input ends of the adder circuit 230 separately. The first modulation unit 210 and the second modulation unit 220 have generally identical circuit functions.

The first modulation unit 210 modulates the input signal 3 by using the primary local oscillation signal 241 to generate the first modulation signal 211, and the second modulation unit 220 modulates the input signal 3 by using the primary local oscillation signal 241 to generate the second modulation signal 221. The adder circuit 230 adds the first modulation signal 211 and the second modulation signal 221 to generate an output signal 231.

In some embodiments, the primary local oscillation signal 241 includes the first local oscillation signal LO1, the second local oscillation signal LO2, the third local oscillation signal LO3, and the fourth local oscillation signal LO4. The first local oscillation signal LO1, the second local oscillation signal LO2, the third local oscillation signal LO3, and the fourth local oscillation signal LO4 have identical duty cycles and identical amplitudes, but different phases. The input signal 3 includes an in-phase signal I and a quadrature signal Q, and a phase difference between the in-phase signal I and the quadrature signal Q is approximately 90 degrees. In some embodiments, a phase difference between the first local oscillation signal LO1 and the third local oscillation signal LO3, between the third local oscillation signal LO3 and the second local oscillation signal LO2, and between the second local oscillation signal LO2 and the fourth local oscillation signal LO4 ranges from 80 degrees to 100 degrees; the phase difference is preferably 90 degrees.

Herein, the input signal 3 being connected in a reverse manner to the first modulation unit 210 and the second modulation unit 220 in the high-gain modulator 200 is used as an example. That is, if the first modulation unit 210 samples the in-phase signal I of the input signal 3 by using the first local oscillation signal LO1 and second local oscillation signal LO2 of the primary local oscillation signal 241 and samples the quadrature signal Q of the input signal 3 by using the third local oscillation signal LO3 and fourth local oscillation signal LO4 of the primary local oscillation signal 241, the second modulation unit 220 samples the quadrature signal Q of the input signal 3 by using the first local oscillation signal LO1 and second local oscillation signal LO2 of the primary local oscillation signal 241 and samples the in-phase signal I of the input signal 3 by using the third local oscillation signal LO3 and fourth local oscillation signal LO4 of the primary local oscillation signal 241. Therefore, the first modulation signal 211 and the second modulation signal 221 have approximately the same amplitude values and have a phase difference therebetween.

In some embodiments, the phase difference between the first modulation signal 211 and the second modulation signal 221 may be 90 degrees.

Therefore, the input signal 3 can be sampled completely by the two modulation units 210 and 220, thereby improving a conversion gain.

For ease of comprehension, in all the embodiments of the present invention, the input signal being a single-side band (SSB) signal is used as an example, but the present invention is not limited thereto.

Figure 3:
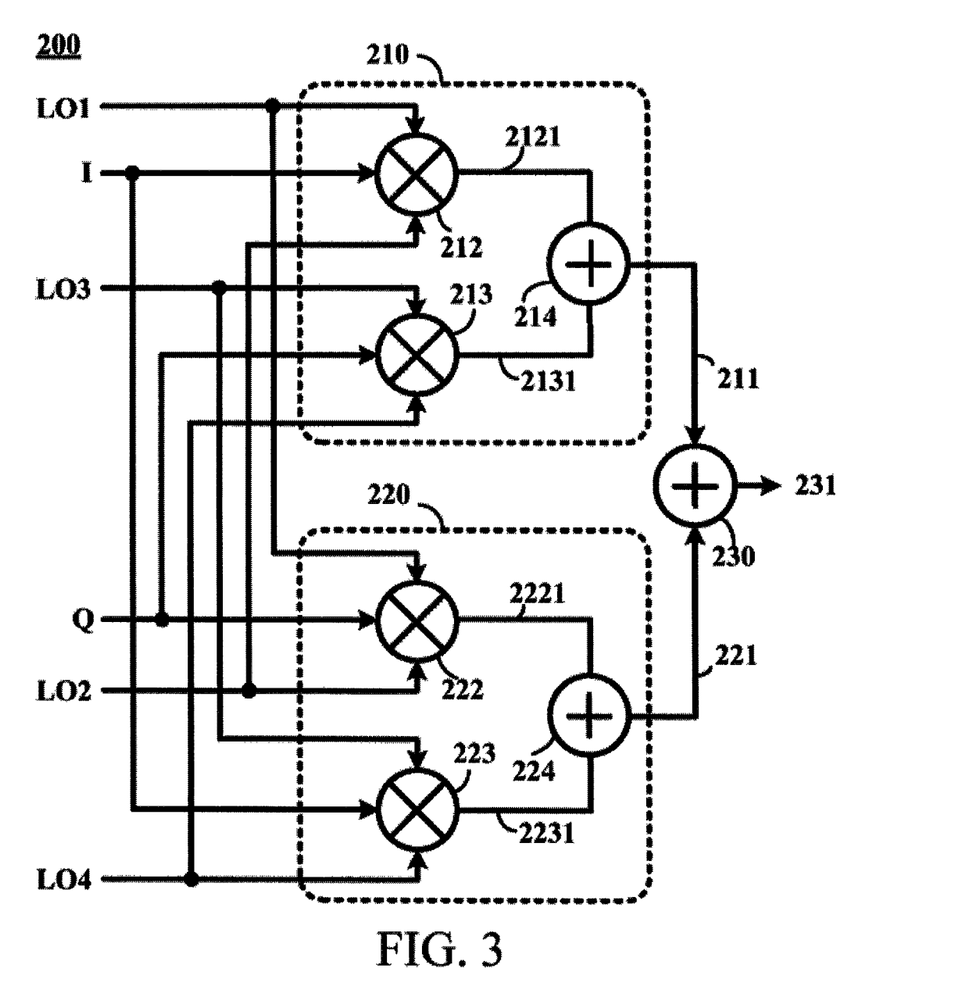
FIG. 3 is a general block diagram of an embodiment of a modulator in FIG. 2.

FIG. 3 is a general block diagram of an embodiment of a modulator in FIG. 2. Referring to FIG. 3, in some embodiments, the first modulation unit 210 includes at least two mixers (which are called a first mixer 212 and a second mixer 213 below) and the first adder 214.

Three input ends of the first mixer 212 are electrically connected to the previous stage circuit (not shown in the figure) and a signal source circuit (not shown in the figure) separately, and separately receive an in-phase signal I from the previous stage circuit and the first local oscillation signal LO1 and the second local oscillation signal LO2 from the signal source circuit. Three input ends of the second mixer 213 are electrically connected to the previous stage circuit (not shown in the figure) and the signal source circuit (not shown in the figure) separately, and separately receive a quadrature signal Q from the previous stage circuit and the third local oscillation signal LO3 and the fourth local oscillation signal LO4 from the signal source circuit. An output end of the first mixer 212 and an output end of the second mixer 213 are electrically connected to the two input ends of the first adder 214 separately. An output end of the first adder 214 is electrically connected to the adder circuit 230.

The first mixer 212 samples the in-phase signal I based on the first local oscillation signal LO1 and the second local oscillation signal LO2 to generate a first sampled signal 2121, and the second mixer 213 samples the quadrature signal Q based on the third local oscillation signal LO3 and the fourth local oscillation signal LO4 to generate a second sampled signal 2131. The first adder 214 receives the first sampled signal 2121 and the second sampled signal 2131, and adds the first sampled signal 2121 and the second sampled signal 2131, to generate the first modulation signal 211 and send the first modulation signal 211 to the adder circuit 230.

The second modulation unit 220 includes at least two mixers (which are called a third mixer 222 and a fourth mixer 223 below) and the second adder 224.

Three input ends of the third mixer 222 are electrically connected to the previous stage circuit (not shown in the figure) and a signal source circuit (not shown in the figure) separately, and separately receive a quadrature signal Q from the previous stage circuit and a first local oscillation signal LO1 and a second local oscillation signal LO2 from the signal source circuit. Three input ends of the fourth mixer 223 are electrically connected to the previous stage circuit (not shown in the figure) and the signal source circuit (not shown in the figure) separately, and separately receive an in-phase signal I from the previous stage circuit and a third local oscillation signal LO3 and a fourth local oscillation signal LO4 from the signal source circuit. An output end of the third mixer 222 and an output end of the fourth mixer 223 are electrically connected to two input ends of the second adder 224 separately. An output end of the second adder 224 is electrically connected to the adder circuit 230.

The third mixer 222 samples the quadrature signal Q based on the first local oscillation signal LO1 and the second local oscillation signal LO2 to generate the third sampled signal 2221, and the fourth mixer 223 samples the in-phase signal I based on the third local oscillation signal LO3 and the fourth local oscillation signal LO4 to generate the fourth sampled signal 2231. The second adder 224 receives and adds the third sampled signal 2221 and the fourth sampled signal 2231, to generate the second modulation signal 221 and send the second modulation signal 221 to the adder circuit 230.

In some embodiments, the adder circuit 230 may be an adder, and adds the first modulation signal 211 and the second modulation signal 221 to generate an output signal 231.

In some embodiments, passive mixers may be used as the mixers 212, 213, 222, and 223, to further reduce the power consumption; however, the present invention is not limited thereto.

Figure 4:
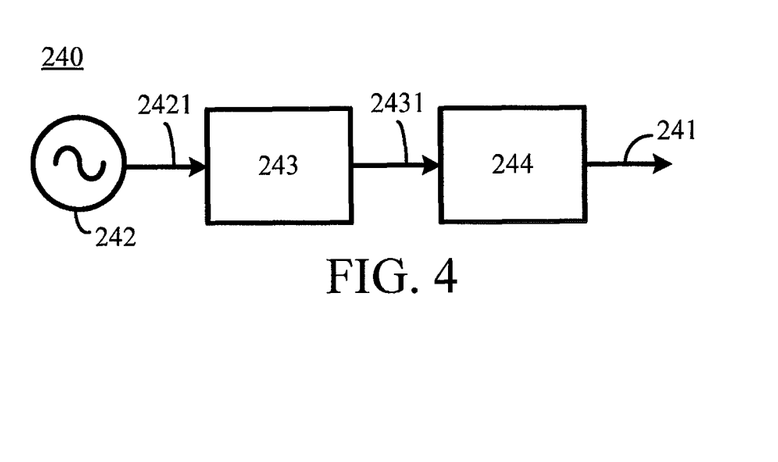
FIG. 4 is a general block diagram of an embodiment of a local oscillation unit in FIG. 2.

In some embodiments, the signal source circuit may be included in the high-gain modulator 200. Referring to FIG. 4, the high-gain modulator 200 further includes a local oscillation unit 240, and the local oscillation unit 240 is used to generate a primary local oscillation signal 241. The local oscillation unit 240 includes a local oscillator 242, a frequency divider 243, and a duty cycle generator 244.

The local oscillator 242, the frequency divider 243, and the duty cycle generator 244 are sequentially connected in series. An output end of the duty cycle generator 244 is electrically connected to the first modulation unit 210 and the second modulation unit 220.

After generating an oscillation signal 2421, the local oscillator 242 sends the oscillation signal 2421 to the frequency divider 243. The frequency divider 243 divides the oscillation signal 2421 to obtain the required local oscillation frequency, and generates the quad-phase output signals 2431. Herein, the quad-phase output signals 2431 have the duty cycles of 50%, and have different phases.

The duty cycle generator 244 converts the duty cycles of the quad-phase output signals 2431 into the required duty cycles, which serve as the primary local oscillation signal 241.

Figure 5:
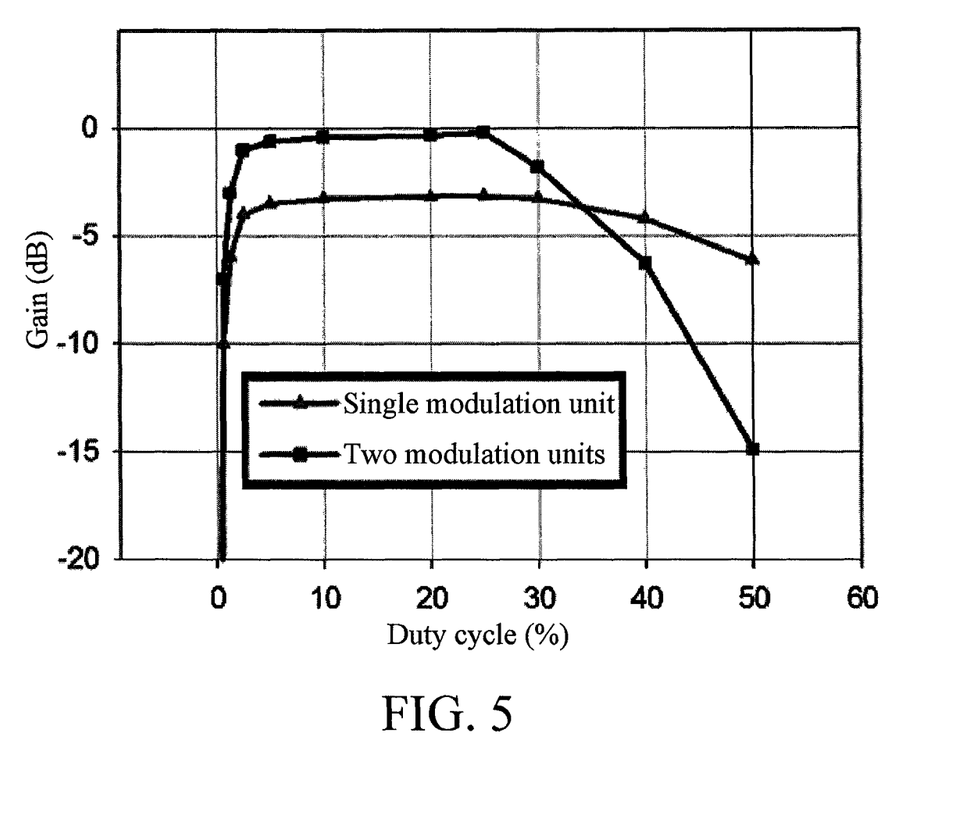
FIG. 5 is a diagram of conversion gain comparison of a high-gain modulator according to an embodiment of the present invention and a conventional modulator with respect to duty cycle of the primary local oscillation signal.

In some embodiments, the required duty cycle of the primary local oscillation signal 241 may be below 35%. Referring to FIG. 5, when the required duty cycle width of the primary local oscillation signal 241 is below 35%, the high-gain modulator 200 that uses two modulation units according to the present invention achieves higher gain than a single modulation unit. In addition, when the required duty cycle of the primary local oscillation signal 241 is approximately 25%, the high-gain modulator 200 that uses two modulation units according to the present invention achieves maximum gain, which is about 3 dB higher than gain achieved by a modulator that uses a single modulation unit.

Therefore, as shown in FIG. 5, in the high-gain modulator 200 that uses two modulation units according to the present invention, a usable range of the required duty cycle of the primary local oscillation signal 241 is approximately 3% to 35% (because if the duty cycle width is below 3%, the acquired gain is excessively low).

In addition, primary local oscillation signals 241 sent to the mixers 212, 213, 222, and 223 have different phases, to avoid turning on the mixers 212, 213, 222, and 223 at the same time.

In some embodiments, the signal source circuit may also be placed outside the high-gain modulator 200. In other words, the oscillation signal 2421 is not limited to being generated by the local oscillator, and the oscillation signal 2421 can also be injected by an external apparatus.

In some embodiments, referring to FIG. 6, the frequency divider includes at least two flip-flops (which are called a first flip-flop DFF1 and a second flip-flop DFF2 below) and buffers B1, B2, B3, and B4. Four buffers are used as an example for description below.

The first output end Q of the first flip-flop DFF1 is electrically connected to the first input end D of the second flip-flop DFF2 and an input end of the buffer B1. The second output end $\overline{Q}$ of the first flip-flop DFF1 is electrically connected to the second input end $\overline{D}$ of the second flip-flop DFF2 and an input end of the buffer B2. The first output end Q of the second flip-flop DFF2 is electrically connected to an input end of the buffer B3, and returns to the second input end $\overline{D}$ of the first flip-flop DFF1. A second output end $\overline{Q}$ of the second flip-flop DFF2 is electrically connected to an input end of the buffer B4, and returns to the first input end D of the first flip-flop DFF1. A control end of the first flip-flop DFF1 and a control end of the second flip-flop DFF2 separately receive oscillation signals Clkp and Clkn.

The first flip-flop DFF1 generates two output signals under the control of the oscillation signal Clkp. After two output signals of the first flip-flop DFF1 are separately subject to buffering processing of the buffer B1 and the buffer B2, the output end of the buffer B1 outputs the first quad-phase output signal V_I+, and the output end of the buffer B2 outputs the second quad-phase output signal V_I–.

The second flip-flop DFF2 generates two output signals under the control of the oscillation signal Clkn. After two output signals of the second flip-flop DFF2 are separately subject to buffering processing of the buffer B1 and the buffer B2, the output end of the buffer B3 outputs the third quad-phase output signal V_Q+, and the output end of the buffer B4 outputs the fourth quad-phase output signal V_Q–. Detailed circuit components and operation of the flip-flops and buffers are well known in the art, and therefore, are not described herein again.

The two oscillation signals Clkp and Clkn are the foregoing oscillation signals 2421, and the first quad-phase output signal V_I+, the second quad-phase output signal V_I–, the third quad-phase output signal V_Q+, and the fourth quad-phase output signal V_Q– are the foregoing quad-phase output signals 2431.

Figure 8:
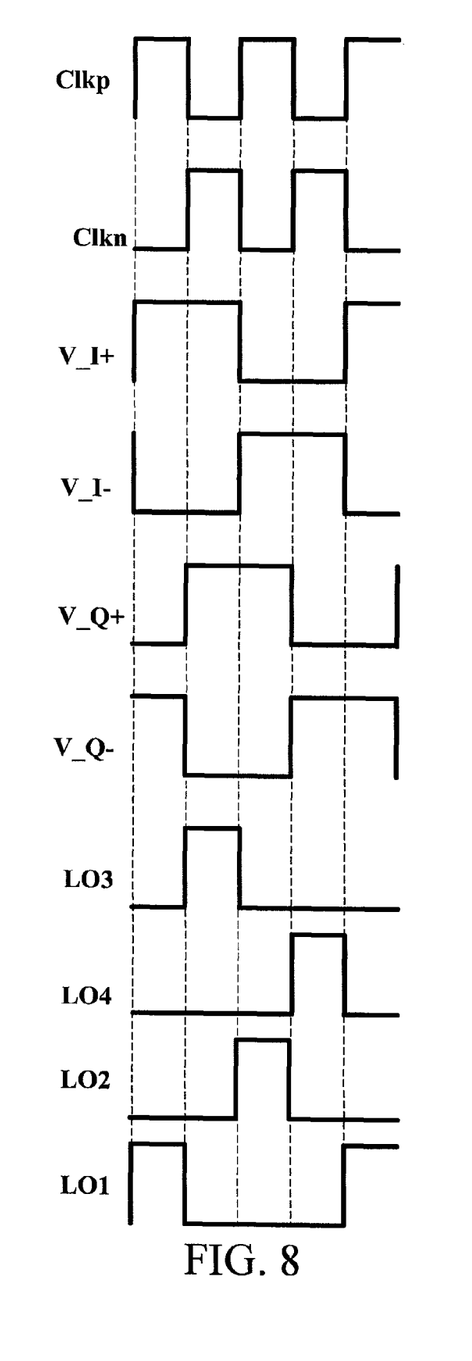
FIG. 8 shows the waveforms of the input signals to the frequency divider, the output signals of the divider, and the 25% duty-cycle local oscillation signals.

Further, referring to FIG. 8, the oscillation signal Clkp and the oscillation signal Clkn are differential signals. The first quad-phase output signal V_I+ and the second quad-phase output signal V_I– are differential signals; the third quad-phase output signal V_Q+ and the fourth quad-phase output signal V_Q– are also differential signals.

The first quad-phase output signal V_I+ and the third quad-phase output signal V_Q+ have a phase difference; the second quad-phase output signal V_I– and the fourth quad-phase output signal V_Q– also have a phase difference. In some embodiments, the phase difference may be 90 degrees.

As shown in FIG. 8, the duty cycles of the first quad-phase output signal V_I+, the second quad-phase output signal V_I–, the third quad-phase output signal V_Q+, and the fourth quad-phase output signal V_Q– generated by the frequency divider are 50%.

Figure 7:
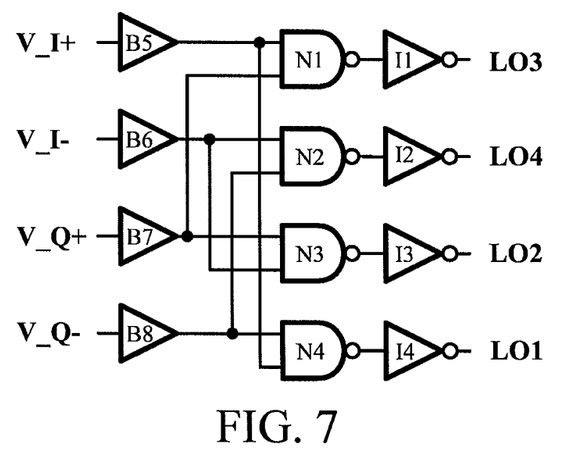
FIG. 7 is a general schematic view of an embodiment of a duty cycle generator in FIG. 4.

FIG. 7 is a general schematic view of an embodiment of a duty cycle generator in FIG. 4. In this embodiment, the duty cycle generator converting a duty cycle of 50% into a duty cycle of 25% is used as an example for detailed description.

The duty cycle generator includes buffers B5, B6, B7, and B8, NAND gates N1, N2, N3, and N4, and inverters I1, I2, I3, and I4. The following description uses four buffers, four NAND gates, and four inverters as an example.

Figure 6:
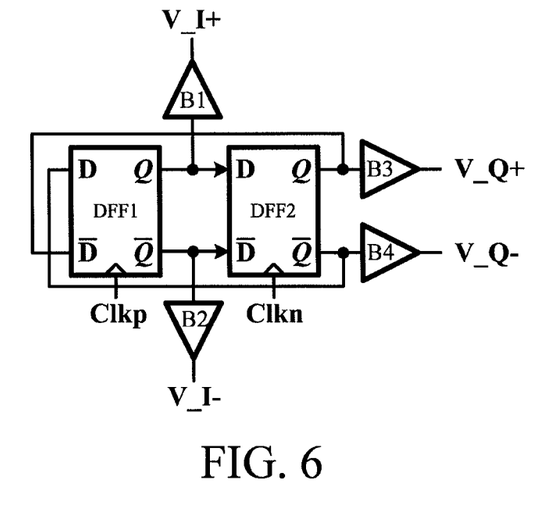
FIG. 6 is a general schematic view of an embodiment of a frequency divider in FIG. 4.

Referring to FIG. 6, an input end of the buffer B5 is electrically connected to an output end of the buffer B1, and an output end of the buffer B5 is electrically connected to the first input end of the NAND gate N1 and the second input end of the NAND gate N4.

An input end of the buffer B6 is electrically connected to an output end of the buffer B2, and an output end of the buffer B6 is electrically connected to the first input end of the NAND gate N2 and the second input end of the NAND gate N3.

An input end of the buffer B7 is electrically connected to an output end of the buffer B3, and an output end of the buffer B7 is electrically connected to the first input end of the NAND gate N3 and the second input end of the NAND gate N1.

An input end of the buffer B8 is electrically connected to an output end of the buffer B4, and an output end of the buffer B8 is electrically connected to the first input end of the NAND gate N4 and the second input end of the NAND gate N2.

Output ends of the NAND gates N1, N2, N3, and N4 are electrically connected to input ends of the inverters I1, I2, I3, and I4 separately.

The input end of the buffer B5 receives the first quad-phase output signal V_I+, the input end of the buffer B6 receives the second quad-phase output signal V_I–, the input end of the buffer B7 receives the third quad-phase output signal V_Q+, and the input end of the buffer B8 receives the fourth quad-phase output signal V_Q–.

The NAND gate N1 performs logical operation on output of the buffer B5 and buffer B7, and sends an operation result to the inverter I1. The inverter I1 performs Boolean compliment on the operation result of the NAND gate N1, to generate the third local oscillation signal LO3. The NAND gate N2 performs logical operation on output of the buffer B6 and buffer B8, and sends an operation result to the inverter I2. The inverter I2 performs Boolean compliment on the operation result of the NAND gate N2, to generate the fourth local oscillation signal LO4. The NAND gate N3 performs logical operation on output of the buffer B7 and buffer B6, and sends an operation result to the inverter I3. The inverter I3 performs Boolean compliment on the operation result of the NAND gate N3, to generate the second local oscillation signal LO2. The NAND gate N4 performs logical operation on output of the buffer B8 and buffer B5, and sends an operation result to the inverter I4. The inverter I4 performs Boolean compliment on the operation result of the NAND gate N4, to generate the first local oscillation signal LO1.

Referring to FIG. 8, the duty cycle of the four local oscillation signals LO1, LO2, LO3, and LO4 may be 25%. In addition, the first local oscillation signal LO1, the third local oscillation signal LO3, the second local oscillation signal LO2, and the fourth local oscillation signal LO4 have different phases; a phase difference exists between the first local oscillation signal LO1 and the third local oscillation signal LO3, between the third local oscillation signal LO3 and the second local oscillation signal LO2, and between the second local oscillation signal LO2 and the fourth local oscillation signal LO4. In some embodiments, the phase difference between the first local oscillation signal LO1 and the third local oscillation signal LO3, between the third local oscillation signal LO3 and the second local oscillation signal LO2, and between the second local oscillation signal LO2 and the fourth local oscillation signal LO4 ranges from 80 degrees to 100 degrees; the phase difference is preferably 90 degrees.

The following further describes two modulation units 210 and 220, where the primary local oscillation signal 241 being connected to the modulation units 210 and 220 in a reverse manner is used as an example.

Figure 9:
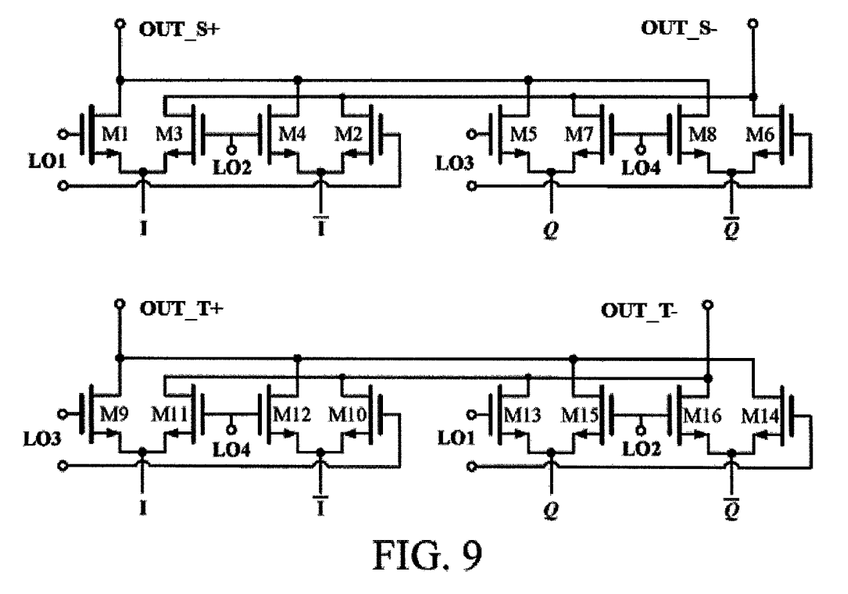
FIG. 9 is a general schematic view of an embodiment of two modulation units in FIG. 2.

Referring to FIG. 2, FIG. 7, and FIG. 9, the circuit in the upper part and the circuit in the lower part of FIG. 9 represent the modulation unit 210 and the modulation unit 220, respectively. The in-phase signal I, the quadrature signal Q, and two modulation signals 211 and 221 are all differential signals. In other words, the in-phase signal I includes the first in-phase signal I and the second in-phase signal Ī; the quadrature signal Q includes the first quadrature signal Q and the second quadrature signal Q̄. The modulation signal 211 includes modulation signals OUT_S+ and OUT_S–, and the modulation signal 221 includes modulation signals OUT_T+ and OUT_T–.

The first local oscillation signal LO1 is connected to control ends of transistors M1, M2, M13, and M14. The second local oscillation signal LO2 is connected to control ends of transistors M3, M4, M15, and M16. The third local oscillation signal LO3 is connected to control ends of transistors M5, M6, M9, and M10. The fourth local oscillation signal LO4 is connected to control ends of transistors M7, M8, M11, and M12.

The first in-phase signal I is connected to first ends of the transistors M1, M3, M9, and M11. The second in-phase signal Ī is connected to first ends of the transistors M2, M4, M10, and M12. The first quadrature signal Q is connected to first ends of the transistors M5, M7, M13, and M15. The second quadrature signal $\overline{Q}$ is connected to first ends of the transistors M6, M8, M14, and M16.

Second ends of the transistor M1, transistor M4, transistor M5, and transistor M8 are connected to each other to generate a modulation signal OUT_S+. Second ends of the transistor M2, transistor M3, transistor M6, and transistor M7 are connected to each other to generate a modulation signal OUT_S−. Second ends of the transistor M9, transistor M12, transistor M14, and transistor M15 are connected to each other to generate a modulation signal OUT_T+. Second ends of the transistor M10, transistor M11, transistor M13, and transistor M16 are connected to each other to generate a modulation signal OUT_T−.

Figure 10:
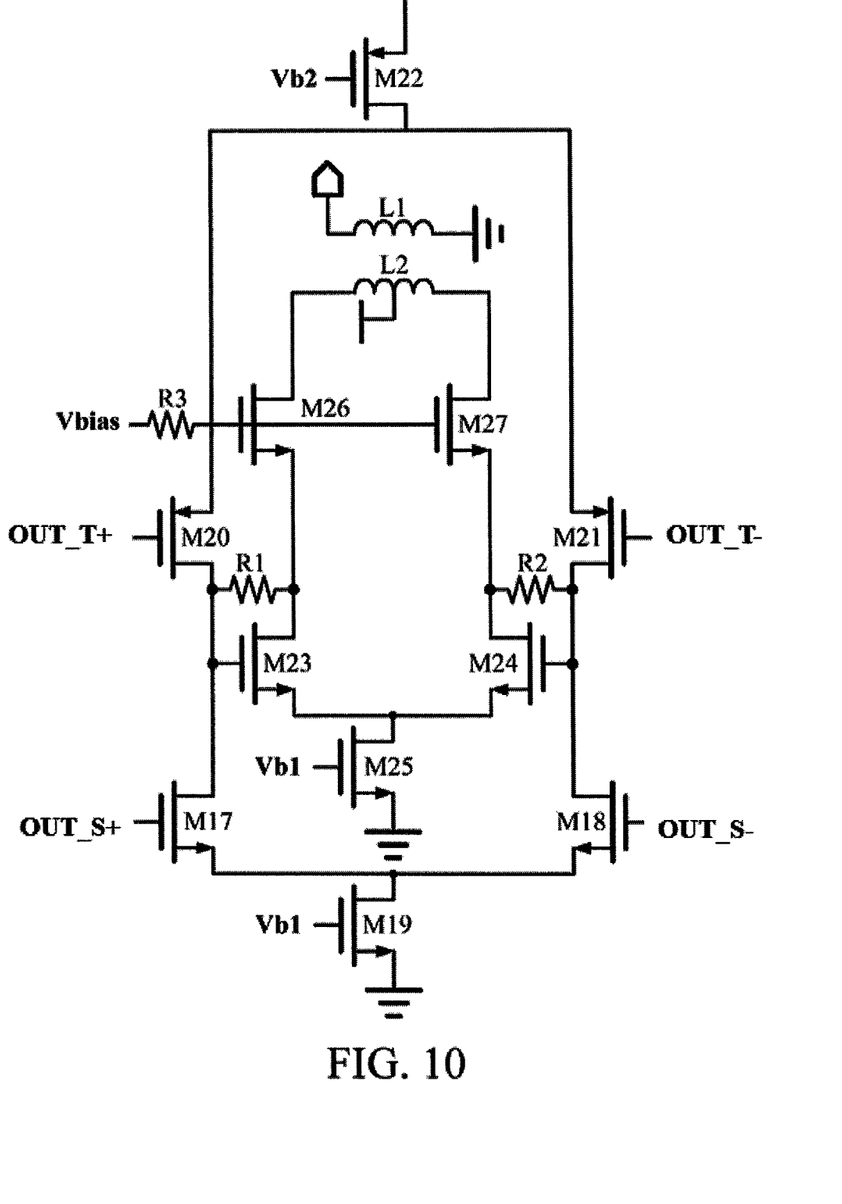
FIG. 10 is a general schematic view of an embodiment of an adder circuit in FIG. 2.

The adder circuit adds signals by using a stack technique; finally, an output balun is used to convert the differential signal into the single-ended signal, and output the single-ended signal.

FIG. 10 is a general schematic view of an embodiment of an adder circuit in FIG. 2.

Referring to FIG. 10, the adder circuit includes transistors M17 to M25, inductors L1 and L2, and resistors R1, R2, and R3.

A control end of the transistor M17 receives the modulation signal OUT_S+. A control end of the transistor M18 receives the modulation signal OUT_S−. A control end of the transistor M20 receives the modulation signal OUT_T+. A control end of the transistor M21 receives the modulation signal OUT_T−. A bias voltage Vb1 is input to control ends of the transistors M19 and 25. A bias voltage Vb 2 is input to a control end of the transistor M22.

First ends of the transistors M17 and M18 are connected to the second end of the transistor M19, and the first end of the transistor M19 is grounded. The second end of the transistor M17 is connected to the second end of the transistor M20, the control end of the transistor M23, and the first end of the resistor R1. The second end of the transistor M18 is connected to the second end of the transistor M21, the control end of the transistor M24, and the first end of the resistor R2. The first ends of the transistors M20 and M21 are connected to the second end of the transistor M22, and the first end of the transistor M22 is connected to the highest power supply.

The first ends of the transistors M23 and M24 are connected to the second end of the transistor M25, and the first end of the transistor M25 is grounded. The second end of the transistor M23 is connected to the second end of the resistor R1 and a first end of the transistor M26. The second end of the transistor M24 is connected to the second end of the resistor R2 and the first end of the transistor M27. The control ends of the transistors M26 and M27 are connected to the first end of the resistor R3, and the second end of the resistor R3 is connected to the bias voltage Vbias. The first end of the inductor L2 is connected to the second end of the transistor M26, and the second end of the inductor L2 is connected to the second end of the transistor M27. The first end of the inductor L1 is connected to the transmit end F1, and the second end of the inductor L1 is grounded; the central tap of the inductor L1 is connected to the highest power supply.

Figure 11A:
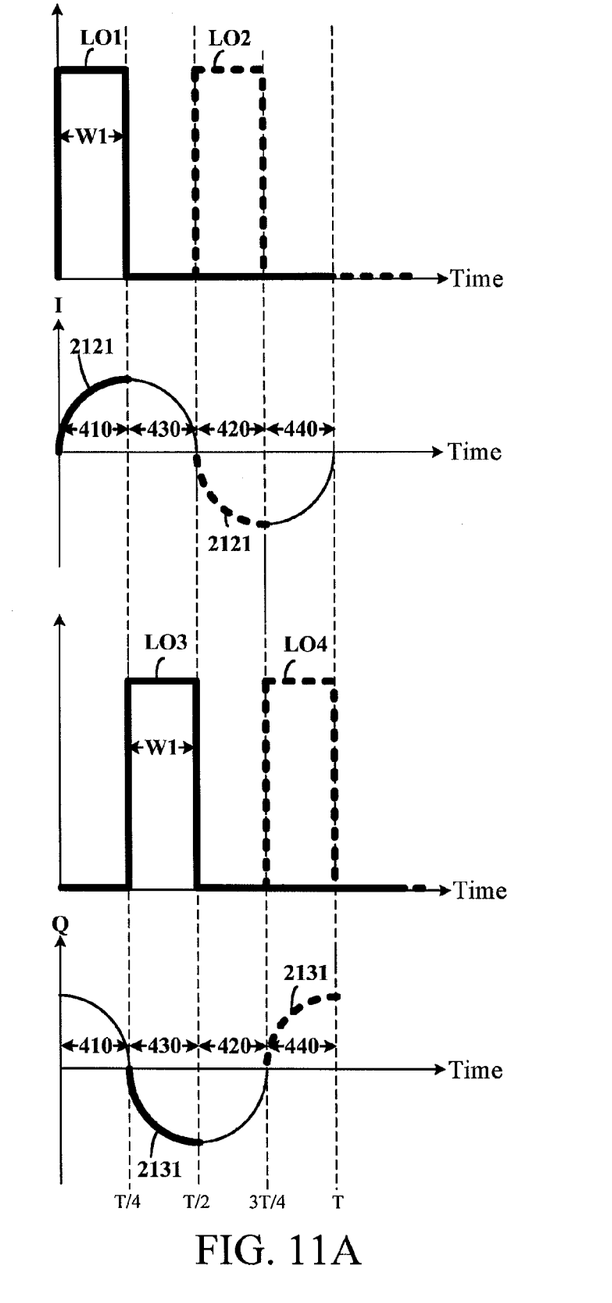
FIG. 11A shows the waveforms of sampled signals in an embodiment during implementation of a high-gain modulator according to an embodiment of the present invention.
Figure 11B:
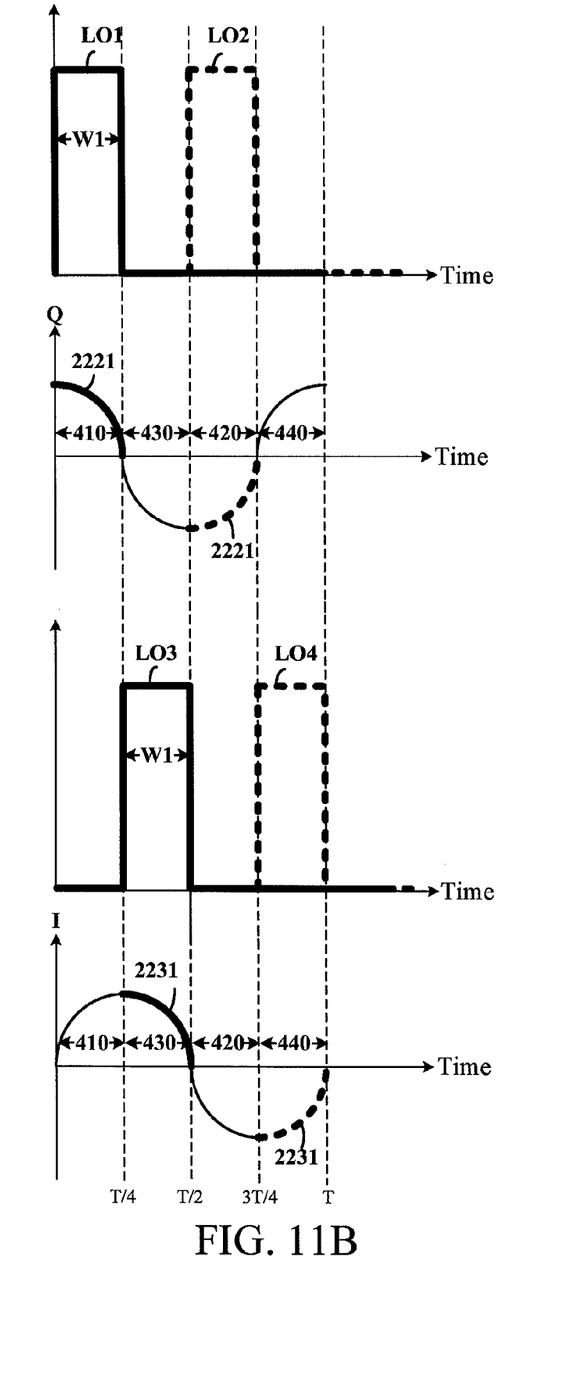
FIG. 11B shows the waveforms in the other path of sampled signals in an embodiment during implementation of a high-gain modulator according to an embodiment of the present invention.

Referring to FIG. 3, FIG. 11A, and FIG. 11B, in a communications system, the first input signal and the second input signal may have a phase difference of 90 degrees. That is, the first input signal and the second input signal may be equivalent to the in-phase signal I and the quadrature signal Q. Therefore, if the first input signal is the in-phase signal I, the second input signal is the quadrature signal Q.

In the following description, the in-phase signal I being equivalent to the first input signal, and the quadrature signal Q being equivalent to the second input signal is used as an example. In addition, the first input signal and the second input signal have a phase difference. In some embodiments, the phase difference between the first input signal and the second input signal may be 90 degrees.

Based on a duty cycle W1 of a given signal, the first mixer 212 samples the in-phase signal I by using a first local oscillation signal LO1 in a first timeslot 410 and a second local oscillation signal LO2 in a second timeslot 420 in each cycle of the given signal, to generate a first sampled signal 2121.

Based on the duty cycle W1 of the given signal, the second mixer 213 samples the quadrature signal Q by using a third local oscillation signal LO3 in a third timeslot 430 and a fourth local oscillation signal LO4 in a fourth timeslot 440 in each cycle of the given signal, to generate a second sampled signal 2131.

Based on the duty cycle W1 of the given signal, the third mixer 222 samples the quadrature signal Q by using the first local oscillation signal LO1 in the first timeslot 410 and the second local oscillation signal LO2 in the second timeslot 420 in each cycle of the given signal, to generate a third sampled signal 2221.

Based on the duty cycle W1 of the given signal, the fourth mixer 223 samples the in-phase signal I by using the third local oscillation signal LO3 in the third timeslot 430 and the fourth local oscillation signal LO4 in the fourth timeslot 440 in each cycle of the given signal, to generate a fourth sampled signal 2231.

A sampled part of each sampled signal is shown by solid lines in bold and dashed lines in FIG. 11A and FIG. 11B.

Figure 12:
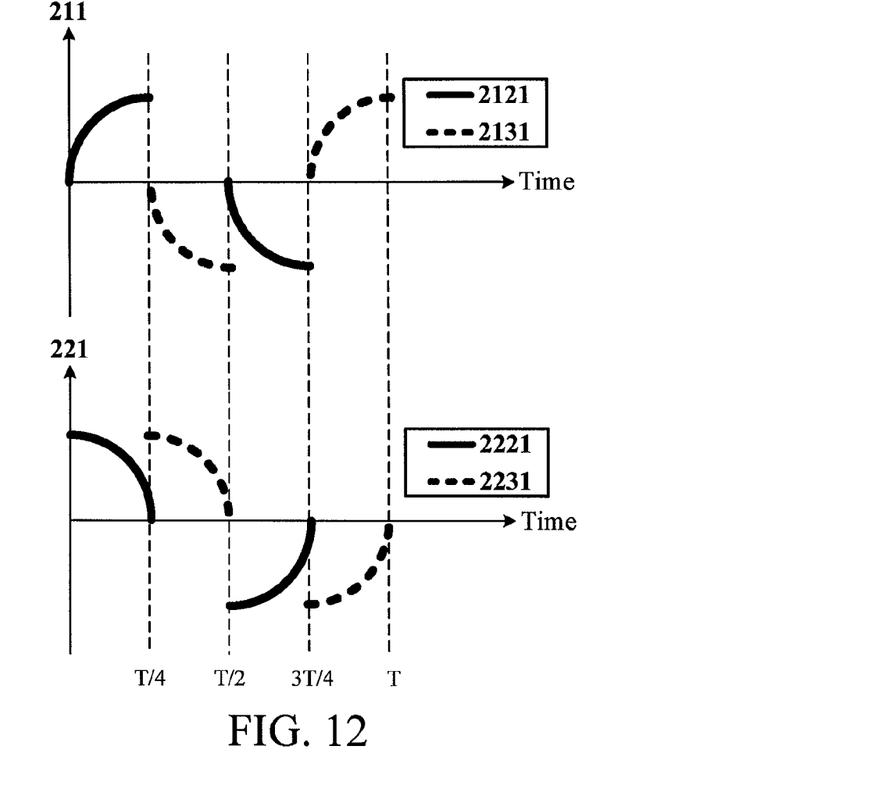
FIG. 12 shows the waveforms of modulation signals in an embodiment during implementation of a high-gain modulator according to an embodiment of the present invention.
Figure 13:
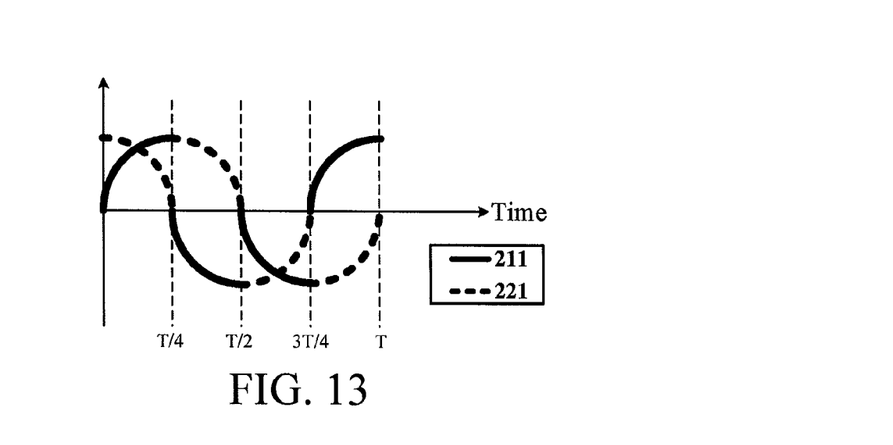
FIG. 13 shows the waveforms of two modulation signals in an embodiment during implementation of a high-gain modulator according to an embodiment of the present invention.

The first adder 214 adds the first sampled signal 2121 and the second sampled signal 2131 to generate a first modulation signal 211. The second adder 224 adds the third sampled signal 2221 and the fourth sampled signal 2231 to generate a second modulation signal 221. The two modulation signals are shown in FIG. 12. As shown in FIG. 13, the first modulation signal 211 and the second modulation signal 221 are put in the same figure, so as to make it clear that the modulation method provided in the present invention can sample and use the fully cycles of the in-phase signal I and quadrature signal Q.

The adder circuit 230 adds the first modulation signal 211 and the second modulation signal 221 to generate an output signal 231.

It can be seen that, the modulation method according to an embodiment of the present invention is as follows:

Referring to FIG. 11A and FIG. 11B, herein, the duty cycle W1 of the given signal being 25% is used as an example, and the given signal in the following can be equivalent to the foregoing local oscillation signal, but the present invention is not limited thereto. For example, the duty cycle W1 of the given signal may be less than 35%, as shown in FIG. 5.

In addition, a cycle of the given signal is divided into multiple timeslots. Herein, the cycle being divided into four timeslots (which are called the first timeslot 410, the third timeslot 430, the second timeslot 420, and the fourth timeslot 440 below) are used as an example for description. A time difference exists between the first timeslot 410 and the third timeslot 430, between the third timeslot 430 and the second timeslot 420, and between the second timeslot 420 and the fourth timeslot 440.

In other words, a cycle of the given signal is represented by "T". The first timeslot 410 is 0 to T/4, the third timeslot 430 is T/4 to T/2, the second timeslot 420 is T/2 to 3T/4, and the fourth timeslot 440 is 3T/4 to T.

In some embodiments, the width of these timeslots 410, 420, 430, and 440 is approximately one-fourth of the cycle of the given signal, and the time difference value is approximately one-fourth of the cycle value of the given signal.

Referring to FIG. 11A and FIG. 11B, "T" represents one cycle. The first local oscillation signal LO1 is used to sample the in-phase signal I from 0 to T/4 (first timeslot 410), and the second local oscillation signal LO2 is used to sample the in-phase signal I from T/2 to 3T/4 (second timeslot 420), so as to generate the first sampled signal 2121. Therefore, the first sampled signal 2121 is a segment waveform of the in-phase signal I from 0 to T/4 and from T/2 to 3T/4.

The third local oscillation signal LO3 is used to sample the quadrature signal Q from T/4 to T/2 (third timeslot 430), and the fourth local oscillation signal LO4 is used to sample the quadrature signal Q from 3T/4 to T (fourth timeslot 440), so as to generate the second sampled signal 2131. Therefore, the second sampled signal 2131 is a segment waveform of the quadrature signal Q from T/4 to T/2 and from 3T/4 to T.

Similarly, the third sampled signal 2221 is the segment waveform of the quadrature signal Q from 0 to T/4 and from T/2 to 3T/4; the fourth sampled signal 2231 is a segment waveform of the in-phase signal I from T/4 to T/2 and from 3T/4 to T.

Then, one or more adders are used to combine all obtained signals (that is, the first sampled signal 2121, the second sampled signal 2131, the third sampled signal 2221, and the fourth sampled signal 2231) to form an output signal.

In some embodiments, the high-gain modulator 200 may be applied to a radio frequency transmitter circuit or a radio frequency receiver circuit. The following description uses a radio frequency transmitter circuit as an example.

Figure 14:
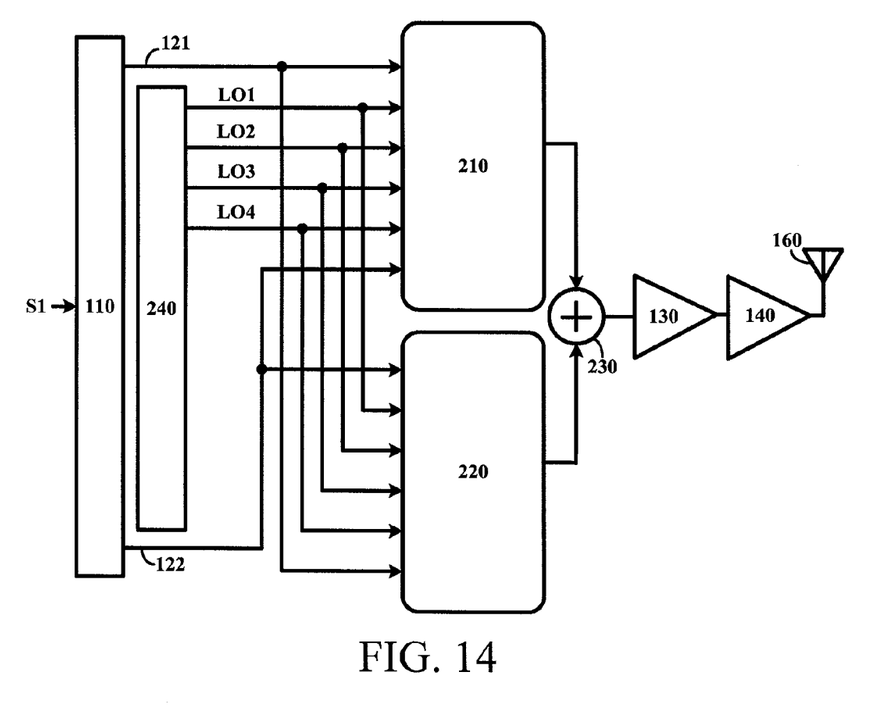
FIG. 14 is a general block diagram of a radio frequency transmitter using an embodiment of the present invention.

FIG. 14 is a general schematic view of a radio frequency transmitter circuit according to an embodiment of the present invention.

Referring to FIG. 14, the radio frequency transmitter circuit includes a digital-to-analog conversion circuit 110 (namely, the foregoing front-end circuit), the first modulation unit 210, the second modulation unit 220, an adder circuit 230, a local oscillation unit 240, a driver circuit 130, a power amplifier 140, and an antenna 160.

The digital-to-analog conversion circuit 110 receives a baseband signal S1, and outputs the first input signal 121 and the second input signal 122. Herein, the first input signal 121 and the second input signal 122 may be equivalent to the foregoing in-phase signal I and quadrature signal Q, respectively.

Two input ends of the first modulation unit 210 are electrically connected to the digital-to-analog conversion circuit 110, and receive the first input signal 121 and second input signal 122 from the digital-to-analog conversion circuit 110. Four control ends of the first modulation unit 210 are electrically connected to the local oscillation unit 240, and receive the first local oscillation signal LO1, the second local oscillation signal LO2, the third local oscillation signal LO3, and the fourth local oscillation signal LO4 from the local oscillation unit 240.

Similarly, two input ends of the second modulation unit 220 are electrically connected to the digital-to-analog conversion circuit 110, and receive the first input signal 121 and second input signal 122 from the digital-to-analog conversion circuit 110. Four control ends of the second modulation unit 220 are electrically connected to the local oscillation unit 240, and receive the first local oscillation signal LO1, the second local oscillation signal LO2, the third local oscillation signal LO3, and the fourth local oscillation signal LO4 from the local oscillation unit 240. Herein, the second modulation unit 220 receives the first input signal 121 and second input signal 122 in a reverse manner relative to the first modulation unit 210.

Output ends of the first modulation unit 210 and the second modulation unit 220 are electrically connected to two input ends of the adder circuit 230 separately. An output end of the adder circuit 230 is electrically connected to an input end of the driver circuit 130. An output end of the driver circuit 130 is electrically connected to an input end of the power amplifier 140. An output end of the power amplifier 140 is electrically connected to the antenna 160.

Detailed components and operation of the two modulation units have been disclosed in the foregoing; detailed components and operation of other elements are well known in the art, and therefore, are not described herein again.

In summary, in the modulation method for improving signal conversion gain and the high-gain modulator thereof according to the present invention, two modulation units are used for modulation, and a group of input signals (for example, two input signals or four local oscillation signals) are input to the two modulation units in a forward manner and a reverse manner separately, so that signal energy is fully utilized and an energy waste is avoided, thereby improving the gain of the output signal and reduce the power consumption of the entire circuit (for example, a radio frequency transmitter circuit or a radio frequency receiver circuit). In other words, no matter the modulation method for improving signal conversion gain and the high-gain modulator thereof according to the present invention are used in a radio frequency transmitter circuit, a radio frequency receiver circuit, or other circuits having a modulation apparatus, signal energy can be fully utilized, thereby improving the conversion gain and reducing the overall power consumption.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A modulation method for improving signal conversion gain, comprising:
   sampling a first input signal by using a first local oscillation signal and a second local oscillation signal to generate a first sampled signal;
   sampling a second input signal by using a third local oscillation signal and a fourth local oscillation signal to generate a second sampled signal, wherein the first input signal and the second input signal have a phase difference, and the first local oscillation signal, the second local oscillation signal, the third local oscillation signal, and the fourth local oscillation signal have different phases;
   sampling the second input signal by using the first local oscillation signal and the second local oscillation signal to generate a third sampled signal;
   sampling the first input signal by using the third local oscillation signal and the fourth local oscillation signal to generate a fourth sampled signal;
   adding the first sampled signal and the second sampled signal to generate a first modulation signal;
   adding the third sampled signal and the fourth sampled signal to generate a second modulation signal; and
   adding the first modulation signal and the second modulation signal to generate an output signal.

2. The modulation method according to claim 1, wherein the phase difference is 90 degrees.

3. The modulation method according to claim 1, wherein a phase difference between the first local oscillation signal and the third local oscillation signal, between the third local oscillation signal and the second local oscillation signal, and between the second local oscillation signal and the fourth local oscillation signal ranges from 80 degrees to 100 degrees.

4. The modulation method according to claim 1, further comprising:
    generating the first local oscillation signal, the second local oscillation signal, the third local oscillation signal, and the fourth oscillation local signal by a local oscillation unit.

5. The modulation method according to claim 4, wherein a duty cycle of the first local oscillation signal, the second local oscillation signal, the third local oscillation signal, and the fourth oscillation local signal is less than 35%.

6. The modulation method according to claim 1, wherein the sampling step is performed by a mixer.

7. A high-gain modulator, comprising:
    a first modulation unit that modulates an input signal by using a first local oscillation signal, a second local oscillation signal, a third local oscillation signal, and a fourth local oscillation signal to generate a first modulation signal, wherein the first local oscillation signal, the second local oscillation signal, the third local oscillation signal, and the fourth local oscillation signal have different phases;
    a second modulation unit that modulates the input signal by using the first local oscillation signal, the second local oscillation signal, the third local oscillation signal, and the fourth local oscillation signal to generate a second modulation signal, wherein the first modulation signal and the second modulation signal have a phase difference; and
    an adder circuit that adds the first modulation signal and the second modulation signal to generate an output signal.

8. The modulator according to claim 7, wherein a phase difference between the first local oscillation signal and the third local oscillation signal, between the third local oscillation signal and the second local oscillation signal, and between the second local oscillation signal and the fourth local oscillation signal ranges from 80 degrees to 100 degrees.

9. The modulator according to claim 8, wherein the input signal comprises an in-phase signal and a quadrature signal.

10. The modulator according to claim 7, further comprising:
    a local oscillation unit, used to generate the first local oscillation signal, the second local oscillation signal, the third local oscillation signal, and the fourth local oscillation signal.

11. The modulator according to claim 10, wherein the local oscillation unit comprises:
    a local oscillator that generates an oscillation signal;
    a frequency divider that divides the oscillation signal to generate a plurality of quad-phase output signals; and
    a duty cycle generator that converts a duty cycle of the plurality of quad-phase output signals into a duty cycle required by the primary local oscillation signal, so as to output the first local oscillation signal, the second local oscillation signal, the third local oscillation signal, and the fourth local oscillation signal.

12. The modulator according to claim 11, wherein the duty cycle required by the first local oscillation signal, the second local oscillation signal, the third local oscillation signal, and the fourth local oscillation signal is less than 35%.

13. The modulator according to claim 7, wherein the input signal comprises an in-phase signal and a quadrature signal, the first modulation unit further comprises:
    a first mixer, for sampling the in-phase signal by using the first local oscillation signal and the second local oscillation signal to generate a first sampled signal;
    a second mixer, for sampling the quadrature signal by using the third local oscillation signal and the fourth local oscillation signal to generate a second sampled signal; and
    a first adder, for adding the first sampled signal and the second sampled signal to generate the first modulation signal.

14. The modulator according to claim 13, wherein the second modulation unit further comprises:
    a third mixer, for sampling the quadrature signal by using the first local oscillation signal and the second local oscillation signal to generate a third sampled signal;
    a fourth mixer, for sampling the in-phase signal by using the third local oscillation signal and the fourth local oscillation signal to generate a fourth sampled signal; and
    a second adder, for adding the third sampled signal and the fourth sampled signal to generate the second modulation signal.

15. A modulation method, comprising:
    based on a duty cycle of a given signal, sampling an in-phase signal in a first timeslot and a second timeslot in each cycle of the given signal, to generate a first sampled signal;
    based on the duty cycle of the given signal, sampling a quadrature signal in a third timeslot and a fourth timeslot in each cycle of the given signal, to generate a second sampled signal;
    based on the duty cycle of the given signal, sampling the quadrature signal in the first timeslot and the second timeslot in each cycle of the given signal, to generate a third sampled signal;
    based on the duty cycle of the given signal, sampling the in-phase signal in the third timeslot and the fourth timeslot in each cycle of the given signal, to generate a fourth sampled signal, wherein a time difference exists between the first timeslot and the third timeslot, between the third timeslot and the second timeslot, and between the second timeslot and the fourth timeslot; and
    combining the first sampled signal, the second sampled signal, the third sampled signal, and the fourth sampled signal to form an output signal.

16. The modulation method according to claim 15, wherein a width of the timeslots is one-fourth of the cycle of the given signal.

17. The modulation method according to claim 16, wherein the duty cycle of the given signal is less than 35%.

18. The modulation method according to claim 17, wherein the sampling action is performed by a mixer.

* * * * *